United States Patent
Chang et al.

(10) Patent No.: US 7,460,251 B2
(45) Date of Patent: Dec. 2, 2008

(54) DIMENSION MONITORING METHOD AND SYSTEM

(75) Inventors: Shih-Ming Chang, Hsin-Chu (TW); Chen-Yuan Hsia, Hsinchu (TW); Wen-Chuan Wang, Taipei (TW); Chi-Lun Lu, Hsinchu (TW); Yen-Bin Huang, Hsinchu (TW); Chang-Cheng Hung, Jhubei (TW); Chia-Jen Chen, Jhudong Township, Hsinchu County (TW); Kai-Chung Liu, Industrial Park (TW); Hsin-Chang Lee, Zhubei (TW); Hong-Chang Hsieh, Hsin-Chu (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 483 days.

(21) Appl. No.: 11/244,601

(22) Filed: Oct. 5, 2005

(65) Prior Publication Data
US 2007/0075037 A1    Apr. 5, 2007

(51) Int. Cl.
*G01B 11/14* (2006.01)
*G03F 7/16* (2006.01)

(52) U.S. Cl. .................. 356/625; 356/630; 430/30; 430/5

(58) Field of Classification Search .............. 356/625, 356/630, 635, 636, 237.1–237.5; 430/5, 430/22, 30, 311, 327; 438/16
See application file for complete search history.

(56) References Cited

U.S. PATENT DOCUMENTS

| 4,408,884 | A | * | 10/1983 | Kleinknecht et al. | ........ 356/496 |
|---|---|---|---|---|---|
| 5,786,112 | A | * | 7/1998 | Okamoto et al. | ............... 430/5 |
| 6,541,388 | B1 | | 4/2003 | Saito | .......................... 438/712 |
| 6,582,619 | B1 | | 6/2003 | Mundt | ......................... 216/83 |
| 6,753,969 | B2 | * | 6/2004 | Degertekin et al. | ......... 356/521 |
| 7,396,621 | B2 | * | 7/2008 | Fujisawa et al. | .............. 430/30 |
| 2004/0032592 | A1 | * | 2/2004 | Venugopal et al. | .......... 356/504 |
| 2005/0133741 | A1 | * | 6/2005 | Schueller et al. | ............ 250/554 |
| 2006/0035395 | A1 | * | 2/2006 | Venugopal | ................... 438/14 |

* cited by examiner

*Primary Examiner*—Hoa Q Pham
(74) *Attorney, Agent, or Firm*—K & L Gates LLP (57) ABSTRACT

A system and method are disclosed for monitoring a dimensional change of a pattern for an object having a transparent layer exposed through the pattern and a non-transparent pattern laminated therewith. According to the method, a first beam is projected to the pattern. A second beam resulted from the first beam passing through the transparent layer exposed by the pattern, or from the first beam reflected from the non-transparent layer of the pattern, is detected. A value of a predetermined property from the second beam detected is obtained. A variation of the value is monitored for identifying the dimensional change of the pattern.

18 Claims, 7 Drawing Sheets

DIMENSION MONITORING METHOD AND SYSTEM

BACKGROUND

The present invention relates generally to semiconductor manufacturing technology, and more particularly to a method and system for monitoring a dimensional change of a pattern for a mask or reticle used in a semiconductor manufacturing process.

Precision and accuracy are two important factors in a process control for semiconductor manufacturing. A method that accurately measures the dimensions of a pattern for a mask or reticle is particularly important for an etching process. Conventional measurement methods, such as plasma intensity method, current bias of inductively coupled plasma (ICP) reactors method, by-product method, are often used to detect the endpoint of an etching process. A basic concept of these conventional methods is to project a beam on a laminated structure undergoing an etching process, and detect a change of intensity of the beam reflected therefrom, when the upper layer of the structure is completely removed. However, these methods do not provide information about critical dimensions of a pattern, and a phase change after an electromagnetic wave passing through the pattern. Such information is particularly important for controlling the quality of the mask or reticle.

Conventionally, the critical dimensions are measured by a scanning electron microscopy (SEM) or other optical metrology tools. A phase change can be measured by atomic force magnifier (AFM), or other optical metrology tools. One shortcoming of the metrology tools is that they are designed to operate after an etching process is completed. Thus, they cannot be used with etching equipment for in-situ measurements.

Desirable in the art of semiconductor manufacturing technology are methods and systems capable of monitoring information, such as a dimensional or phase change, during an etching process.

SUMMARY

This invention provides a system and method for monitoring a dimensional change of a pattern for an object having a transparent layer exposed through the pattern and a non-transparent pattern laminated therewith. In one embodiment of the invention, a first beam is projected to the pattern. A second beam resulted from the first beam passing through the transparent layer exposed by the pattern, or from the first beam reflected from the non-transparent layer of the pattern, is detected. A value of a predetermined property from the second beam detected is obtained. A variation of the value is monitored for identifying the dimensional change of the pattern.

The construction and method of operation of the invention, however, together with additional objects and advantages thereof will be best understood from the following description of specific embodiments when read in connection with the accompanying drawings.

DESCRIPTION

Figure 1:
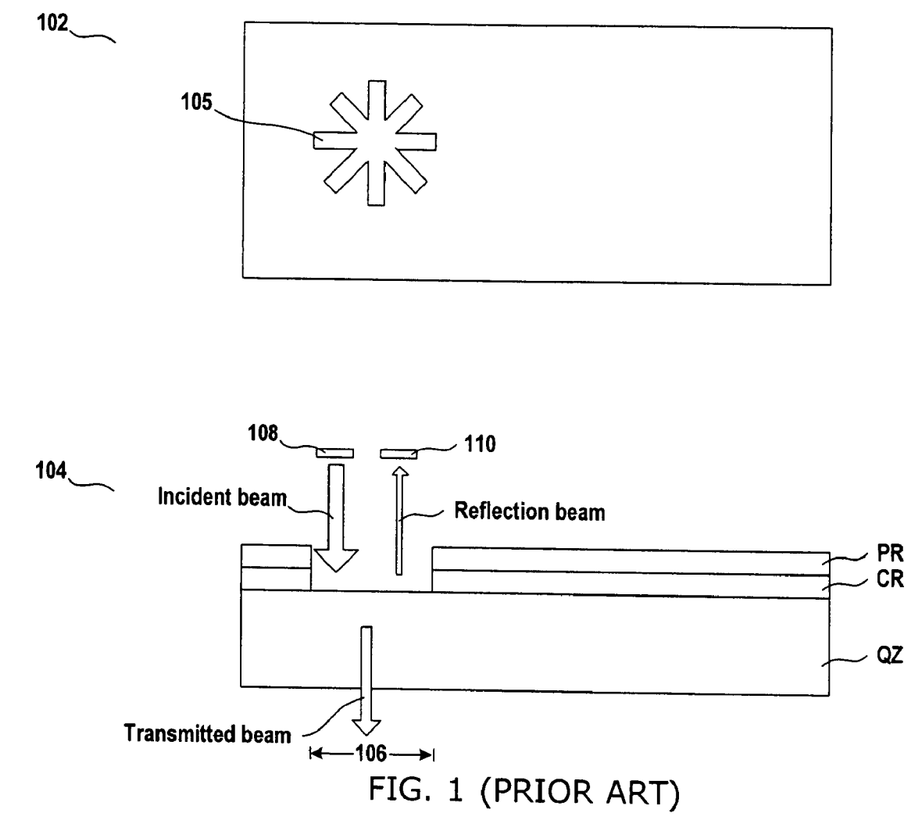
FIG. 1 illustrates top and side views of a mask with a cross mark pattern as used in a conventional measurement method or system.

FIG. 1 illustrates a top view 102 and side view 104 of a mask with a cross mark pattern 105 as used in a conventional reflected beam method for detecting an endpoint during an etching process. The mask is composed of a transparent layer, such as a quartz layer QZ, a non-transparent layer, such as a chromium layer CR, and a photoresist layer PR. As shown in the side view 104, a portion of the photoresist layer PR and chromium layer CR within a monitoring area 106 has been removed in an etching process.

During a detection process, an energy source 108 projects an incident beam to the monitoring area 106. Before the portion of the CR layer was removed, a reflection detector 110 would receive a reflected beam resulted from the incident beam reflected from the CR layer within the monitoring area 106. After the portions of the PR and CR layers are removed, only a small amount of the energy from the incident beam will be reflected back to the reflection detector 110, and most of the energy from the incident beam will travel through the QZ layer as a transmitted beam. By detecting the energy change of the reflected beam, the endpoint for the etching process of the CR layer can therefore be determined.

While the conventional method is effective for detecting the endpoint of an etching process, no further information, such as the critical dimension of the pattern 105 or a phase change between the incident beam and the transmitted beam can be obtained.

Figure 2:
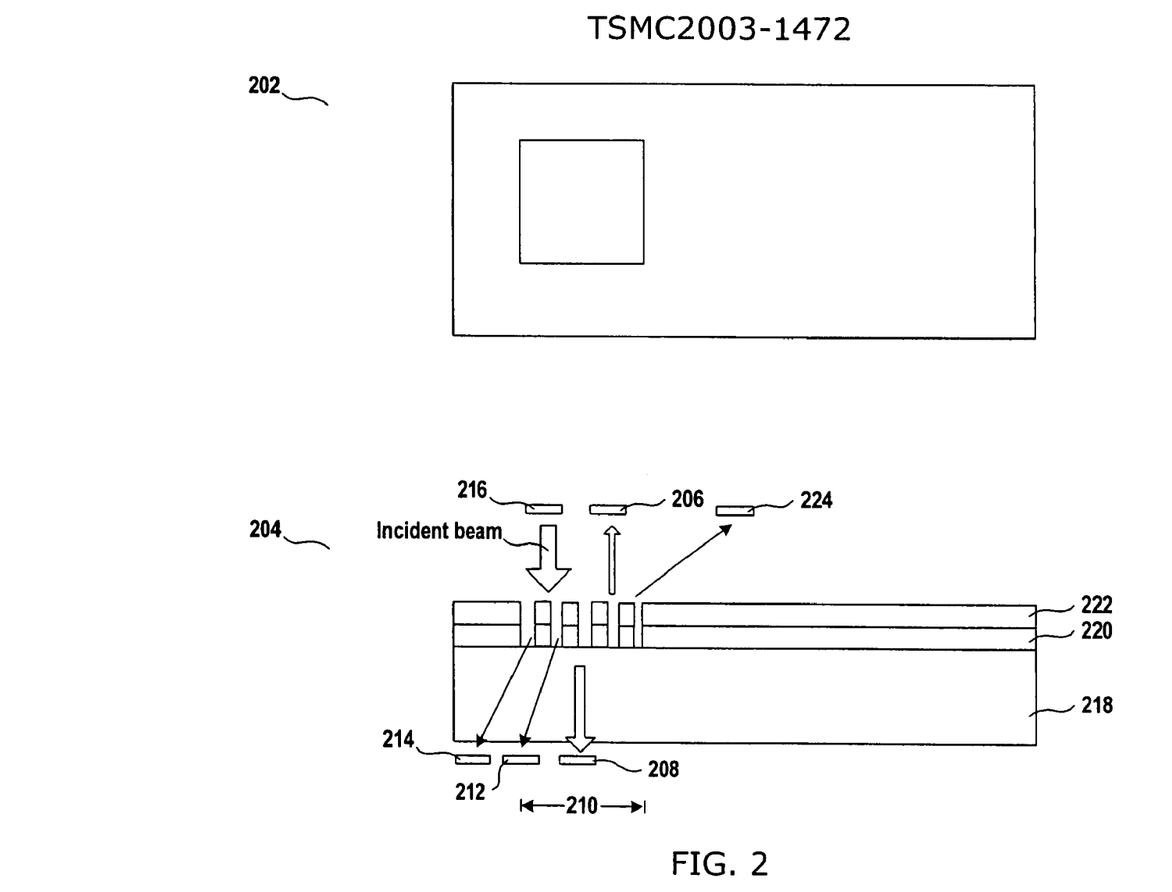
FIG. 2 illustrates top and side views of a mask with a pattern as used in accordance with one embodiment of the present invention.

FIG. 2 illustrates a top view 202 and side view 204 of an object with a pattern as used in accordance with one embodiment of the present invention. The object may be a mask or reticle used in a semiconductor manufacturing process. The object includes a transparent layer 218, a non-transparent layer 220 and a photoresist layer 222, laminated with each other. As an example, the transparent layer 218 is made of quartz. The non-transparent layer 220 can be made of chromium or MoSi. The non-transparent layer 220 can be either a reflective or an opaque type of layer, depending on various embodiments of the present invention. For example, the objects including an opaque layer may be a stencil reticle used in Low Energy E-Beam Proximity Projection Lithography (LEEPL) or ion beam lithography processes. The objects including a reflective layer may be a reflective reticle used in an Extreme-Ultraviolet (EUV) process.

Referring to the side view 204, the pattern is defined within a monitoring area 210, having a ratio between a transparent area and non-transparent area substantially equal to 1:1. In this embodiment, a system is disclosed to monitor a dimensional change of the pattern. The system includes an energy source 216, a reflection detector 206 and a transmission detector 208, where the energy source 216 and the reflection detector 206 are placed at the same side of object, while the transmission detector 208 is placed at the opposite side. The reflection detector 206 detects an endpoint of an etching process. The transmission detector 208 is implemented to detect the transmitted energy from the incident beam passing through the transparent layer 218 where the non-transparent layer 220 is removed.

During a monitoring process, the energy source 216 projects an incident beam to the pattern within the monitoring area 210. The energy source 216 can be a light source, such as a laser beam emitter, or a particle source, such as a particle beam emitter. If the non-transparent layer 220 is intact, most of the incident beam will be reflected back to the reflection detector 206. This provides the system with the capability of detecting the endpoint of an etching process. In this embodiment, since a portion of the photoresist layer 222 and the non-transparent layer 220 within the monitoring area has been removed, less than about 50% of the energy from the incident beam will be reflected back to the reflection detector 206. About one half of the energy from the incident beam will pass through the transparent layer 218 as a transmitted beam. The transmission detector 208 is placed at the back side of the object to receive the transmitted beam.

A data processor (not shown in this figure) is used to obtain a value of a predetermined property from the transmitted beam or the reflected beam for further determining dimensional information of the pattern within the monitoring area 210. The predetermined property is selected depending on the type of energy source being used. For example, if the energy source is a light emitter, the predetermined property will be, for example, intensity, phase, polarization or coherency. If the energy source is a particle emitter, the predetermined property will be, for example, flux, linear velocity, angular velocity or charge. The data processor then monitors the value obtained from the transmitted beam or the reflected beam for identifying the dimensional change of the pattern. For example, after the main etching process is finished and an over etching process begins, the pattern has a ratio substantially equal to 1:1 between the transparent area and the non-transparent area within the monitoring area 210. As a result, the transmitted beam is of about one half the predetermined property value of the incident beam. For instance, if the predetermined value is intensity of light, the transmitted beam would be about one half the intensity of the incident beam. As the etching process goes on, the exposed transparent area may become more than one half of the monitoring area 210. The transmitted beam received at the transmission detector 208 would be of more than one half of the predetermined property than that of the incident beam. Therefore, by monitoring the predetermined property value of the transmitted beam, a dimensional change of the pattern can be determined. It is noteworthy that, as an alternative, the reflected beam can also be used instead to identify the dimensional change of the pattern, using the same concept as described above. As another alternative, a unitless ratio is provided by dividing the predetermined property value of the transmitted beam or reflected beam by the incident beam. Therefore, a dimensional change of the pattern can be determined by monitoring a variation of the ratio.

In this embodiment, the system further includes a deflection detector 212 and diffraction detector 214, placed at the same side as the transmission detector 208. The deflection detector 212 receives the deflected signal resulted from the incident beam passing through the transparent layer 218. The diffraction detector 214 receives the diffracted signal resulted from the incident beam passing through the transparent layer 218. The data processor then compares the deflected beam or diffracted beam with the incident beam to determine a dimensional or phase change therebetween.

In this embodiment, the system further includes a diffraction detector 224 for reflection beam, placed at the same side as the beam source 216. The detector 224 receives the diffracted (or deflected) signal resulted from the incident beam reflecting from the reflective layer 222. The data processor then compares the diffracted (or deflected) beam with the incident beam to determine a dimensional or phase change therebetween.

While this embodiment discloses a system for monitoring a dimensional or phase change, its operation method can be briefly summarized as the following. A incident beam is projected to the pattern. A transmitted beam resulted from the incident beam passing through the transparent layer exposed by the pattern, or a reflected beam resulted from the incident beam reflected from the non-transparent layer of the pattern is detected. A value of a predetermined property from the transmitted or reflected beam is obtained. A variation of the value is monitored for identifying the dimensional change of the pattern.

The operation method can further monitor a phase change, wherein a deflected or diffracted beam resulted from the incident beam deflected or diffracted from the transparent layer of the pattern is detected, and then the deflected or diffracted beam is compared with the incident beam to determine a dimensional or phase change therebetween.

Figure 3:
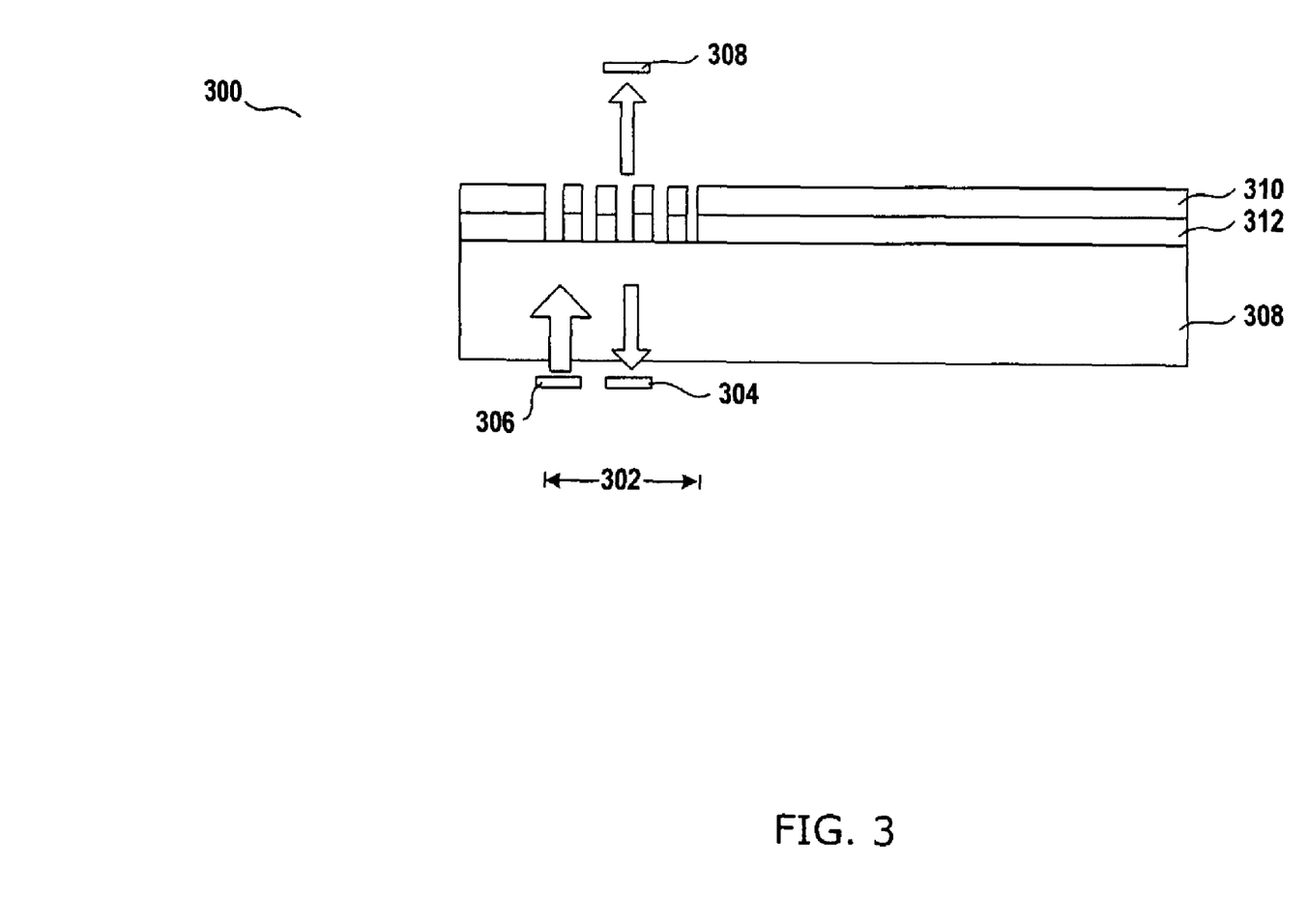
FIG. 3 illustrates a side view of the mask as used in accordance with another embodiment of the present invention.

FIG. 3 illustrates a side view 300 of an object, such as a mask or reticle, as used in accordance with another embodiment of the present invention. In this embodiment, a system and method for monitoring a pattern of an object for the dimensional or phase change is disclosed. An energy source 306 is placed at the bottom side of the object, close to a transparent layer 308. A transmission detector 308 is placed above the object, close to a photoresist layer 310. A reflection detector 304 is placed at the same side as the energy source 306 for receiving signals reflected from the non-transparent layer 312. The system monitors a dimensional or phase change in a way similar to the embodiments as shown in FIG. 2, with a primary difference that the arrangements of the energy source, reflection detector and transmission detector for the two cases are opposite.

Figure 4:
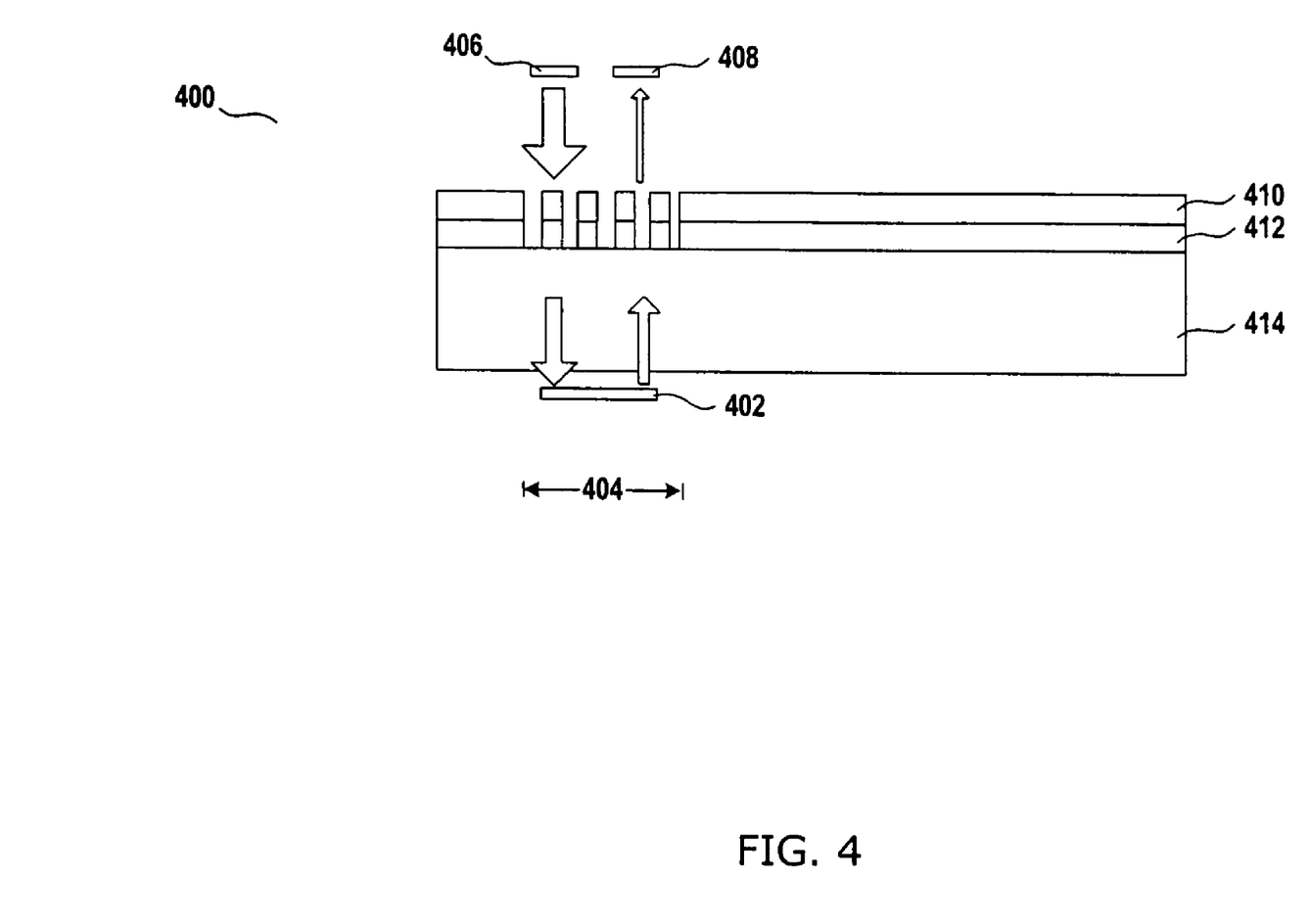
FIG. 4 illustrates a side view of the mask as used in accordance with another embodiment of the present invention.

FIG. 4 illustrates a side view 400 of an object, such as a mask or reticle, as used in accordance with another embodiment of the present invention. In this embodiment, a system and method for monitoring a pattern of the object for the dimensional or phase change is disclosed. An energy source 406 and a transmission detector 408 are placed above a photoresist layer 410. A mirror 402 is placed at the bottom side of the object, close to a transparent layer 414. The system monitors a dimensional and phase change in a way similar to the embodiments as shown in FIG. 2, with a primary difference with regard to the arrangements of the energy source and transmission detector. The energy source 406 projects an incident beam through the openings of the non-transparent layer 412 and the transparent layer 414. The incident beam is then reflected back to the transmission detector 408 by the mirror 402. Therefore, the energy source 406 and the reflection detector 408 can be placed at the same side of the object. It is noteworthy that the energy source 406 and the reflection detector 408 can be placed at the bottom of the object, while the mirror 402 is place at the upside thereof.

FIG. 3 and FIG. 4 are two examples to show the possibility of using mirrors or other optical elements to adjust the path of monitor beams. It is understood that the relative locations of the beam source and the energy detectors are arbitrary.

Figure 5:
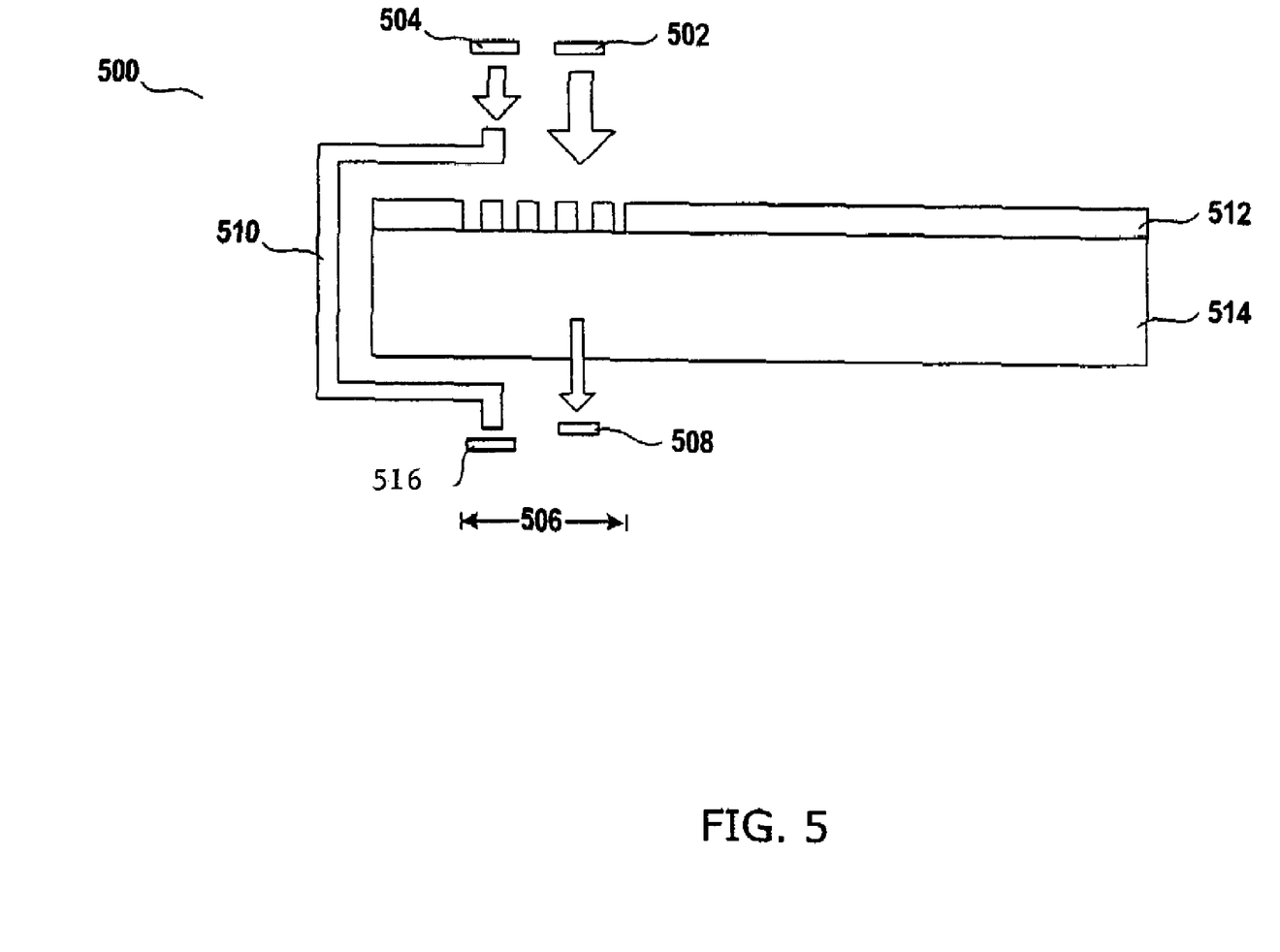
FIG. 5 illustrates a side view of the mask as used in accordance with another embodiment of the present invention.

FIG. 5 illustrates a side view 500 of an object, such as a mask or reticle, as used in accordance with another embodiment of the present invention. In this embodiment, a system and method for monitoring a pattern of the object for the dimensional or phase change is disclosed. An energy source 502 is placed above a non-transparent layer 512 and a transmission detector 508 is placed under a transparent layer 514. A coherent energy source 504 placed at the same side as the energy source 502 projects a beam coherent with the incident beam by the energy source 502, through an optical path 510. The system monitors a dimensional and phase change in a way similar to the embodiments as shown in FIG. 2, with a primary difference with regard to how the phase change is monitored. An additional detector receives the coherent beam from the coherent energy source 504. The coherent beam is then compared with the transmitted beam to determine a phase change therebetween. It is noteworthy that while the coherent energy source 504 and energy source 502 are placed at the side close to the non-transparent layer 512, they may also be placed at the other side close to the transparent layer 514.

Figure 6:
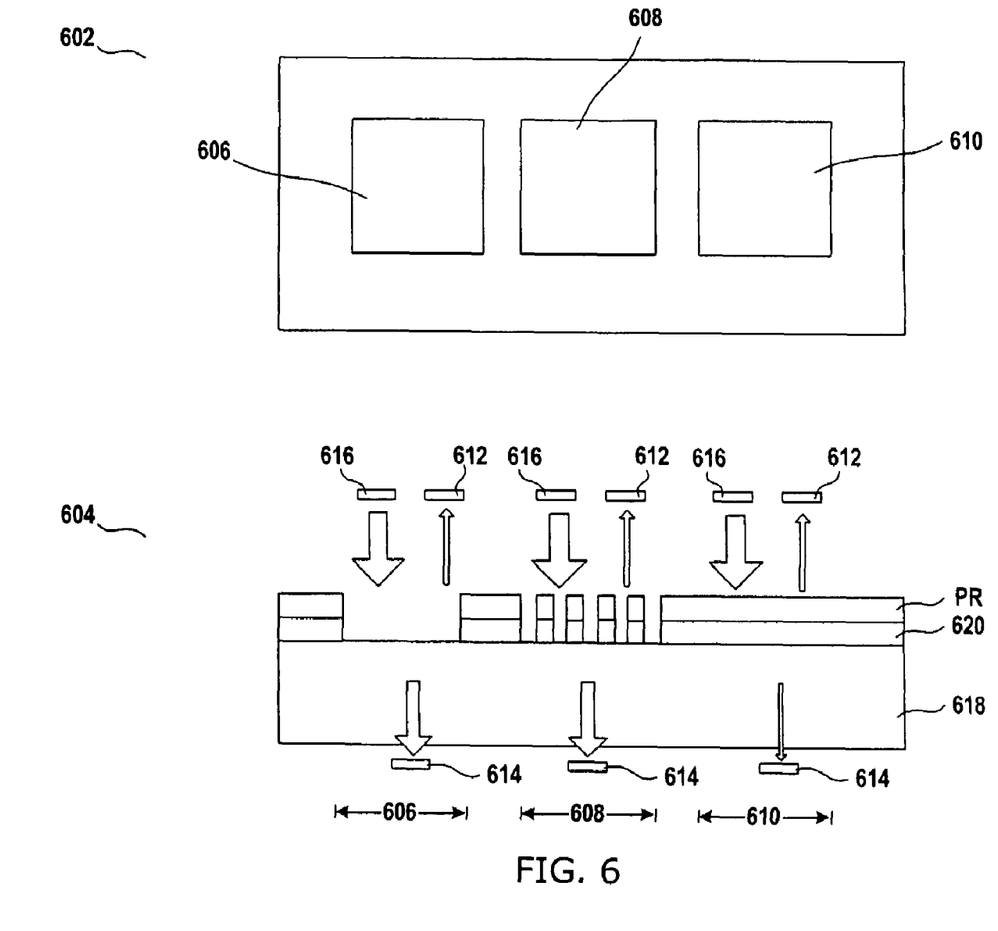
FIG. 6 illustrates top and side views of a mask as used in accordance with another embodiment of the present invention.

FIG. 6 illustrates a top view 602 and side view 604 of a mask as used in accordance with another embodiment of the present invention. In this embodiment, three monitoring areas 606, 608, and 610 are used to monitor a dimensional and phase change. The monitoring areas 606 and 610 are used as reference patterns of a known dimension to assist the measurement of patterns within the monitoring area 608. The monitoring area 606 is a fully opened pattern where all of the non-transparent material within that area is removed. The monitoring area 608 contains the monitor pattern such as a periodic pattern of 1 to 1 ratio, meaning that only half of the non-transparent material within that area is etched. The monitoring area 610 is a non-opened pattern, meaning that none of the non-transparent materials within that area is removed. In the side view 604, a plurality of reflection detectors 612, transmission detectors 614, and energy sources 616 are implemented for the monitoring areas 606, 608, and 610. The reflection detectors 612 can detect an endpoint of an etching process in the monitoring areas 606, 608, and 610. The transmission detectors 614 are implemented to calculate the transmitted energy from the incident beam through the transparent layer 618 where the non-transparent layer 620 is removed.

During a detection process, the energy sources 616 project incident beams to the monitoring areas 606, 608, and 610. If the non-transparent layer 620 is still intact, most of the incident beam will be reflected back to the reflection detectors 612, while some of the energy from the incident beam will travel through the transparent layer 618 to reach the transmission detectors 614. The amount of energy traveling through the transparent layer 618 is determined by how much of the non-transparent layer 620 is removed. For example, transmission energy will be much higher in the monitoring area 606 compared to the transmission energy in the monitoring area 610, since all of the non-transparent layer 620 are removed in the monitoring area 606. With property values obtained from the transmission detectors 614 or the reflection detectors 612, a ratio of the transmitted energy and incident energy can be calculated for all of the three monitoring areas 606, 608, and 610. The ratio for the pattern within the monitoring area 608 is compared with the ratios for the reference patterns within the monitoring areas 606 and 610 for determining a dimensional or phase change. The measurement for monitoring area 608 will be further improved since measurements from monitoring area 606 and 610 will be used as references to assist the measurement of monitoring area 608.

Figure 7:
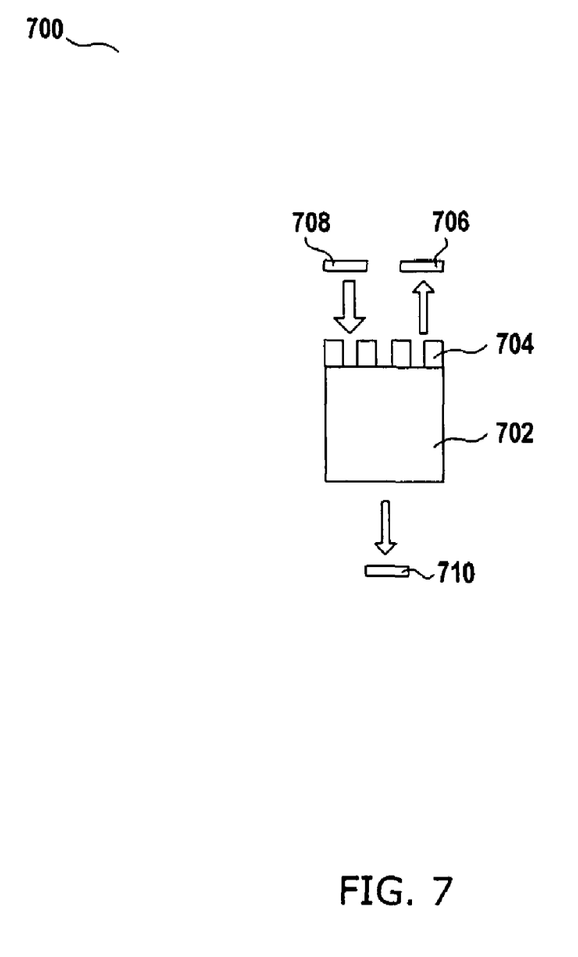
FIG. 7 illustrates a partial cross-sectional view of a semiconductor wafer as used in accordance with another embodiment of the present invention.

FIG. 7 illustrates the side view 700 of a portion of a semiconductor mask or a wafer as used in accordance with another embodiment of the present invention. Both materials 702 and 704 have different reflectivity. By knowing the reflectivity of the materials 702 and 704, dimensions measurements can be calculated by taking readings from a reflection detector 706, when an energy source 708 projects an incident beam at the wafer. For instance, if the reflectivity of the material 702 is higher than the reflectivity of the material 704, the reflective energy received at the reflection detector 706 will be higher as more of material 704 is removed.

Referring to FIG. 7, both materials 702 and 704 have different transmittance. By knowing the transmittance of the materials 702 and 704, dimensions measurements can be calculated by taking readings from a transmission detector 710, when an energy source 708 projects an incident beam at the wafer. For instance, if the transmittance of the material 702 is higher than the transmittance of the material 704, the transmitting energy received at the transmission detector 710 will be higher as more of material 704 is removed.

Although the materials mentioned in this invention are usually described with the characters of non-transparent and transparent, there are absolutely no existing opaque or transparent materials. This invention can be applied to determine the dimensional or phase difference with the difference of the transparent of materials.

This invention provides systems and methods for monitoring dimensional and phase variations during an etching process by using new dimension monitoring utility techniques without losing the ability of taking endpoint captures. These systems and methods collect information regarding the dimensional variation and phase changes with alternative schemes by calculating the ratio of the transmitted energy or the reflective energy with the incident energy within a monitoring area. Since these schemes are durable and easy to integrate into an etching chamber, it is possible to provide in-situ measurements during an etching process.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for monitoring a dimensional change of a pattern for an object having a transparent layer exposed through the pattern and a non-transparent pattern laminated therewith, the method comprising:

projecting a first beam to the pattern;

detecting a second beam resulted from the first beam passing through the transparent layer exposed by the pattern, or reflected from the non-transparent layer of the pattern;

obtaining a value of a predetermined property from the second beam detected; and monitoring a variation of the value for identifying the dimensional change of the pattern, wherein the monitoring includes deriving a ratio from dividing the value of the predetermined property of the second beam by the value of the predetermined property of the first beam.

2. The method of claim 1 wherein the monitoring comprising monitoring a variation of the ratio for identifying the dimensional change of the pattern.

3. The method of claim 1 further comprising:
detecting a third beam resulted from the first beam deflected from the transparent layer of the pattern; and
comparing the third beam with the first beam to determine a phase change therebetween.

4. The method of claim 1 further comprising:
detecting a third beam coherent with the first beam, bypassing the transparent layer or the non-transparent layer;
comparing the third beam with the second beam to determine a phase change therebetween.

5. The method of claim 1 further comprising:
providing a reference pattern of a known dimension, within which the non-transparent layer is completely removed to expose the transparent layer;
projecting a reference beam coherent with the first beam to the reference pattern;
detecting a third beam resulted from the first beam passing through the transparent layer within the reference pattern, or reflected from the non-transparent layer of the reference pattern;
obtaining a value of the predetermined property from the third beam; and
comparing the value of the predetermined property of the third beam with the value of the predetermined property of the second beam to determine the dimensional change of the pattern.

6. The method of claim 1 further comprising:
providing a reference pattern of a known dimension, within which the transparent layer is completely covered by the non-transparent layer;
projecting a reference beam coherent with the first beam to the reference pattern;
detecting a third beam resulted from the first beam passing through the transparent layer within the reference pattern, or reflected from the non-transparent layer of the reference pattern;
obtaining a value of the predetermined property from the third beam; and
comparing the value of the predetermined property of the third beam with the value of the predetermined property of the second beam to determine the dimensional change of the pattern.

7. The method of claim 1 wherein the first and second beams are projected and detected at the same side of the object.

8. The method of claim 1 wherein the first and second beams are projected and detected at opposite sides of the object.

9. A system for monitoring a dimensional change of a pattern for an object having a transparent layer exposed through the pattern and a non-transparent pattern laminated therewith, the system comprising:
an energy source for projecting a first beam to the pattern;
a first detector for detecting a second beam resulted from the first beam passing through the transparent layer exposed by the pattern, or reflected from the non-transparent layer of the pattern;
a data processor for obtaining a value of a predetermined property from the second beam detected, such that a variation of the value may be monitored for identifying the dimensional change of the pattern, wherein the data processor derives a ratio from dividing the value of the predetermined property of second beam by the value of the predetermined property of the first beam.

10. The system of claim 9 further comprising a second detector for detecting a third beam resulted from the first beam deflected from the transparent layer of the pattern.

11. The system of claim 9 further comprising a second detector for detecting a third beam coherent with the first beam, bypassing the transparent layer or the non-transparent layer.

12. The system of claim 9 wherein the object comprises a reference pattern of a known dimension within which the non-transparent layer is completely removed to expose the transparent layer, or within which the transparent layer is completely covered by the non-transparent layer.

13. The system of claim 9 wherein the energy source and the first detector are placed at the same side of the object.

14. The system of claim 13 further comprising a mirror placed at an opposite side of the object with respect to the energy source and the first detector.

15. A method for monitoring a dimensional change of a pattern for an object having a transparent layer exposed through the pattern and a non-transparent pattern laminated therewith, the method comprising:
projecting a first beam to the pattern;
detecting a second beam resulted from the first beam passing through the transparent layer exposed by the pattern, or reflected from the non-transparent layer of the pattern;
obtaining values of a predetermined property from the first and second beams;
deriving a ratio from dividing the value of the predetermined property of second beam by the value of the predetermined property of the first beam;
monitoring a variation of the ratio for identifying the dimensional change of the pattern.

16. The method of claim 15 further comprising:
detecting a third beam resulted from the first beam deflected from the transparent layer of the pattern; and
comparing the third beam with the first beam to determine a phase change therebetween.

17. The method of claim 15 further comprising:
detecting a third beam coherent with the first beam, bypassing the transparent layer or the non-transparent layer;
comparing the third beam with the second beam to determine a phase change therebetween.

18. The method of claim 15 further comprising:
providing a reference pattern of a known dimension within which the non-transparent layer is completely removed to expose the transparent layer, or within which the transparent layer is completely covered by the non-transparent layer;
projecting a reference beam coherent with the first beam to the reference pattern;
detecting a third beam resulted from the first beam passing through the transparent layer within the reference pattern, or reflected from the non-transparent layer of the reference pattern;
obtaining a value of the predetermined property from the third beam; and
comparing the value of the predetermined property of the third beam with the value of the predetermined property of the first beam to determine the dimensional change of the pattern.

* * * * *